US008427357B2

(12) United States Patent
Lee et al.

(10) Patent No.: US 8,427,357 B2
(45) Date of Patent: Apr. 23, 2013

(54) REMOTE CONTROL SYSTEM AND METHOD FOR OPERATING THE SAME

(75) Inventors: Yu-Lung Lee, Miaoli County (TW); Chun Chuan Chen, Taipei County (TW)

(73) Assignee: Powertech Industrial Co., Ltd., Taipei Hsien (TW)

( * ) Notice: Subject to any disclaimer, the term of this patent is extended or adjusted under 35 U.S.C. 154(b) by 579 days.

(21) Appl. No.: 12/703,869

(22) Filed: Feb. 11, 2010

(65) Prior Publication Data

US 2011/0140933 A1 Jun. 16, 2011

(30) Foreign Application Priority Data

Dec. 16, 2009 (TW) ................................ 98143133 A

(51) Int. Cl.
*H04L 17/02* (2006.01)
*H03K 17/94* (2006.01)

(52) U.S. Cl.
USPC ............................................. 341/176; 341/22

(58) Field of Classification Search .................... 341/22, 341/176
See application file for complete search history.

(56) References Cited

U.S. PATENT DOCUMENTS

| | | | | |
|---|---|---|---|---|
| 6,157,319 | A * | 12/2000 | Johns et al. | 340/12.24 |
| 6,320,514 | B1 * | 11/2001 | Flick | 340/12.28 |
| 7,215,238 | B2 * | 5/2007 | Buck et al. | 340/5.23 |
| 7,586,398 | B2 * | 9/2009 | Huang et al. | 340/10.5 |
| 7,679,525 | B2 * | 3/2010 | Nielsen | 340/693.1 |
| 7,737,820 | B2 * | 6/2010 | Flick | 340/5.22 |
| 2004/0070491 | A1 * | 4/2004 | Huang et al. | 340/10.5 |
| 2005/0024228 | A1 * | 2/2005 | Vignon et al. | 340/825.72 |
| 2006/0239379 | A1 | 10/2006 | Horst et al. | |
| 2007/0257982 | A1 | 11/2007 | Luo et al. | |
| 2008/0307451 | A1 * | 12/2008 | Green | 725/25 |

FOREIGN PATENT DOCUMENTS

TW 531983 B 5/2003

* cited by examiner

*Primary Examiner* — Khai M Nguyen
(74) *Attorney, Agent, or Firm* — Rosenberg, Klein & Lee

(57) ABSTRACT

A remote control system is disclosed. The remote control system includes a remote control transmitter module for transmitting a learning signal or a functional signal, and a remote control receiver module in a host for receiving the learning signal or the functional signal wherein the remote control receiver module operates in a learning mode upon a receipt of the learning signal or controls the host to operate functions according the functional signal. When the remote control receiver module operates in the learning mode the remote control receiver module is configured to verify and store the learning signal for recognizing an identity of the remote control transmitter module.

20 Claims, 4 Drawing Sheets

REMOTE CONTROL SYSTEM AND METHOD FOR OPERATING THE SAME

BACKGROUND OF THE INVENTION

1. Field of the Invention

The present invention relates to a remote control system and a method for operating the same. In particular, the present invention relates to remote control system that is capable of operating in a mode that could automatically pair a transmitter and a receiver.

2. Description of Related Art

Radio frequency electronic equipment transmits a signal through wireless radio frequency technique. A communication protocol for such electronic equipment generally should be configured before the equipment is placed into the stream of the commerce. The configuration enables a host to recognize a remote control device so that any key code of the remote control device could correspond to a default key of the host. As such, the remote control device could communicate with the host enabling the host to function.

When the number of the hosts or the remote control devices varies, a manual operation is necessary for reconfiguring the communication links in the conventional approaches.

SUMMARY OF THE INVENTION

One objective of the present invention is to pair the host and the remote control device by operating the remote control receiver module in a learning mode so as to minimize the human operation when the number of the hosts and the remote control devices varies.

The remote control system includes a remote control transmitter module for transmitting a learning signal or a functional signal, and a remote control receiver module in a host for receiving the learning signal or the functional signal wherein the remote control receiver module operates in a learning mode upon a receipt of the learning signal or controls the host to operate functions according the functional signal. When the remote control receiver module operates in the learning mode the remote control receiver module is configured to verify and store the learning signal for recognizing an identity of the remote control transmitter module.

In order to further understand the techniques, means and effects the present invention takes for achieving the prescribed objectives, the following detailed descriptions and appended drawings are hereby referred, such that, through which, the purposes, features and aspects of the present invention can be thoroughly and concretely appreciated; however, the appended drawings are merely provided for reference and illustration, without any intention to be used for limiting the present invention.

DETAILED DESCRIPTION OF THE PREFERRED EMBODIMENTS

Referring now to the accompanying drawings, the preferred embodiments of the present invention will be explained in detail.

Figure 1:
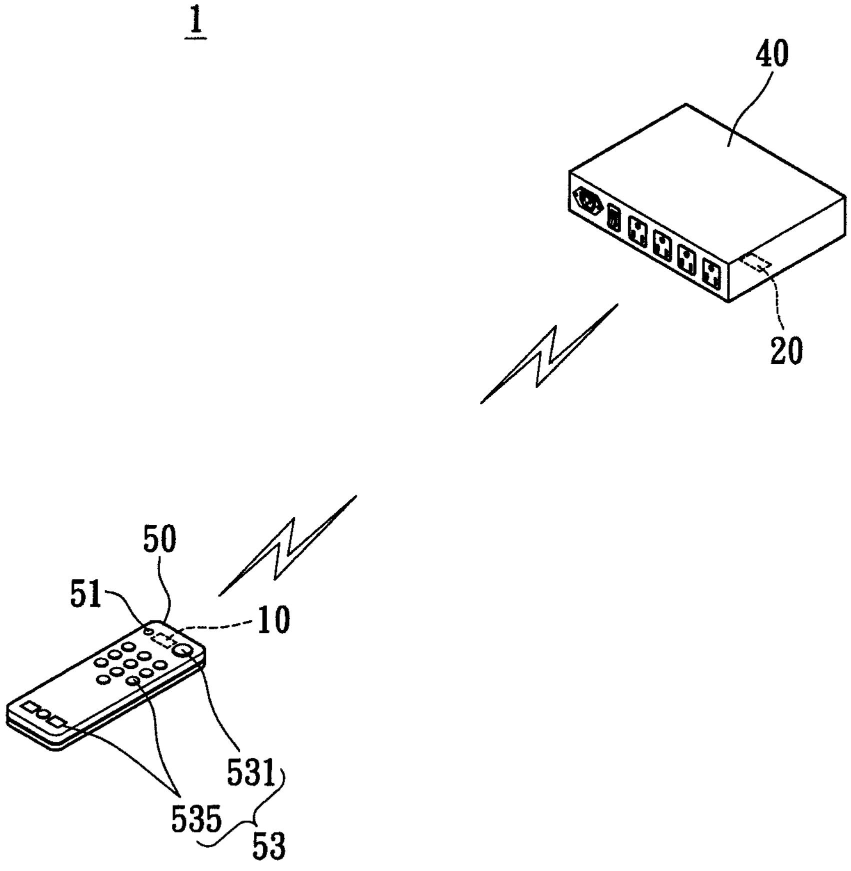
FIG. 1 is a schematic diagram of a remote control system in accordance with one embodiment of the present invention.

FIG. 1 is a schematic diagram of a remote control system with in accordance with one embodiment of the present invention.

Throughout the disclosure, the remote control system 1 includes a host 40 and a remote control device 50, wherein the host 40 has a remote control receiver module 20 and the remote control device 50 has a remote control transmitter module 10. The control interface of the remote control device 50 includes a learning key 51 and a plurality of functional keys 53, wherein the functional keys includes an activation functional key 531 and an execution functional key 535, wherein the activation functional key 531 is a functional key indicative of an activation.

The host 40 could be a socket or a controller of a socket, which receives a remote signal from the remote control transmitter module 10 through a wireless transmission. The remote signal would be a learning signal or a functional signal. The remote control device 50 transmits the learning signal when the learning key 51 for controlling the remote control receiver module 20 to operate in a learning mode is pressed. The purpose of the learning key 51 is configured to pair the host 40 and the remote control device 50. The remote control device 50 transmits the functional signal when the functional keys 53 are pressed for controlling the host 40 to function accordingly. The functional keys may include turning on/off the host 40 and setting up the time to turn on/off the host 40.

Therein, the wireless transmission could be a wireless radio frequency transmission, such as Bluetooth or Wi-Fi wireless transmission, to implement a short-distance wireless communication.

Figure 2:
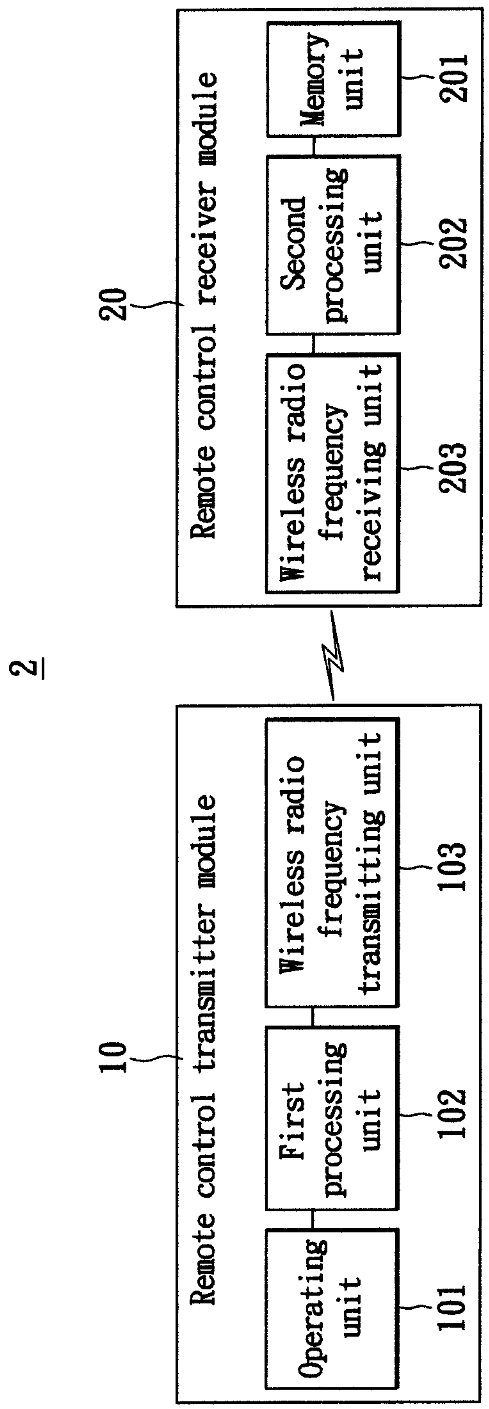
FIG. 2 is a functional block diagram of the remote control system in accordance with one embodiment of the present invention.

FIG. 2 is a functional block diagram of the remote control system in accordance with one embodiment of the present invention.

In conjunction with FIG. 1, a remote control system 2 includes the remote control transmitter module 10 and the remote control receiver module 20. The remote control transmitter module 10 has an operating unit 101, a first processing unit 102 and a wireless radio frequency transmitting unit 103, wherein the first processing unit 102 is coupled with the operating unit 101 and the wireless radio frequency transmitting unit 103. The remote control receiver module 20 has a memory unit 201, a second processing unit 202 and a wireless radio frequency receiving unit 203, wherein the second processing unit 202 is coupled with the memory unit 201 and the wireless radio frequency receiving unit 203.

The wireless radio frequency transmitting unit 103 and the wireless radio frequency receiving unit 203 could be forming a wireless transmitting circuit. The remote control transmitter module 10 transmits the remote control signal. The remote control signal might contain a plurality of information packets. Each of the remote control signals could at least include an identification code, a serial number and a command code, wherein the identification code could be the code that is recognized by the wireless communication protocol for enabling a mutual communication between the remote control transmitter module 10 and the remote control receiver module 20. The electronic equipments of the same brand and of the same type may have the same identification code. The serial number generally represents a product number of the remote control device 50 and is stored in the host 40. Thus, the host 40 may recognize the remote control device 50 without being interfered with other remote control devices of the same brand and of the same type. The command code could be the activation functional code and the execution functional code.

A characteristic of the present invention is the remote control device 50 with a built-in learning code or a learning key. In the other word, the remote signal transmitted by the remote control transmitter module 10 could be the functional signal or the learning signal, wherein the functional signal might be the activation functional signal or the execution functional signal, wherein the activation functional signal is the functional signal indicative of the activation. If there are pluralities of remote control devices 50 of the same brand and of the same type, the packets of the signals emitted may have the same identification code with different serial numbers corresponding to the serial number of the host 40. The serial number includes a manufactured date, a type or a batch number.

The learning signal, the activation functional signal and the execution functional signal may correspond to the different command codes, wherein the command code of the learning signal is a learning code that may cause the remote control receiver module 20 to operate in a learning mode. The command code of the activation functional signal is an activation functional code that is configured to turn on or turn off of the host 40 when it is received by the remote control receiver module 20. The command code of the execution functional signal is associated with an execution functional code, and such command code when received by the remote control receiver module 20 may cause the host 40 to function accordingly such as turn on or turn off the host at a predetermined time.

The remote control transmitter module 10 receives an operating command via the operating unit 101. The first processing unit 102 converts the operating command to the learning signal or the functional signal and outputs the learning signal or the functional signal via the wireless radio frequency transmitting unit 103. The memory unit 201 stores a default identification code, a default serial number and plurality of default command codes. The second processing unit 202 is configured to receive the learning signal and the functional signal via the wireless radio frequency, receiving unit 203 and to verify the received learning signal and/or the functional signal. In the other words, the second processing unit 202 compares the identification code of the learning signal and the functional signal to the default identification code. If the identification code is consistent with the default identification code, the communication between the remote control transmitter module 10 and the remote control receiver module 20 is established. Therefore, the remote control receiver module 20 could read the information in the wake of the establishment of the communication such as the serial number and the command code. If the identification code and the default identification code are not consistent, the remote control transmitter module 10 could not communicate with the remote control receiver module 20.

If the remote control transmitter module 10 could communicate with the remote control receiver module 20, the second processing unit 202 compares the serial number of the received signal with the default serial number. If they are consistent, the remote control receiver module 20 could be recognized by the remote control transmitter module 10. Otherwise, the remote control receiver module 20 is configured to operate in a learning mode in accordance with the learning signal and stores a new serial number in the learning signal that is inconsistent with the default serial number into the memory unit 201. Therefore, the remote control receiver module 20 could be identified by the remote control transmitter module 10 during the next operation.

The host 40 further has a microprocessor (not shown) coupled with the second processing unit 202. The microprocessor operates according to the functional key 53. Upon a receipt of an unrecognizable functional signal (i.e., the serial number of the execution functional signal is inconsistent with the default serial number) by the radio frequency receiving unit 203, the remote control transmitter module 10 may cause an emission of the learning signal. When the remote control receiver module 20 receives the learning signal, the second processing unit 202 may cause the remote control receiver module 20 to be operating in the learning mode. When operating in the learning mode, the remote control receiver module 20 may store the serial number in the learning signal that is in consistent with the default serial number into the memory unit 201. Thus, the host 40 could recognize the remote control device 50. For the host 40 to operate according to the function key 53, the remote control receiver module 20 that is operating in the learning mode may prompt the user to operate the remote control device 50 so as to facilitate the emission of the activation functional signal. The remote control receiver 20 may prompt the user by displaying texts or graphics via a display unit (not shown), or instructing the user to press the activation functional key 531 of the remote control transmitter module 10 via an audio output unit (not shown). The remote control transmitter module 10 transmits the activation functional signal, and then the second processing unit 202 obtains the execution functional code in accordance with the activation functional code in the activation functional signal by means of a logic operation and stores the execution functional code in the memory unit 201. Because the relation between the activation functional code and the execution functional code in the remote control device 50 of the same type and of the same brand could be expressed in terms of the logic operation, the storage of the activation functional code may cause the storage of the execution functional codes into the memory unit 201.

The logical operation could be an accumulation or other computation. If the code value of the activation functional code is 001, for example, the execution functional code such as the code for turning on at the predetermined time could be 002, which is the activation functional code plus one.

Further, the second processing unit 202 determines whether the remote control receiver module 20 has already learned by determining whether a serial number and an execution function code have been stored in the memory unit 201 when the remote control receiver module 20 is turned on. If not, the remote control receiver module 20 is configured to operate in the learning mode awaiting the emission of the activation functional signal from the remote control transmitter module 10 to be received by the remote control receiver module 20. The second processing unit 202 stores the serial number associated with the activation functional signal and obtains the execution functional code by means of the logic operation. Therefore, the remote control receiver module 20 could recognize the execution functional signal from the remote control transmitter module 10 and the second processing unit 202 may transfer the execution code associated with the execution signal so that the remote control receiver module 20 may control the host 40 to operate function accordingly.

Figure 3:
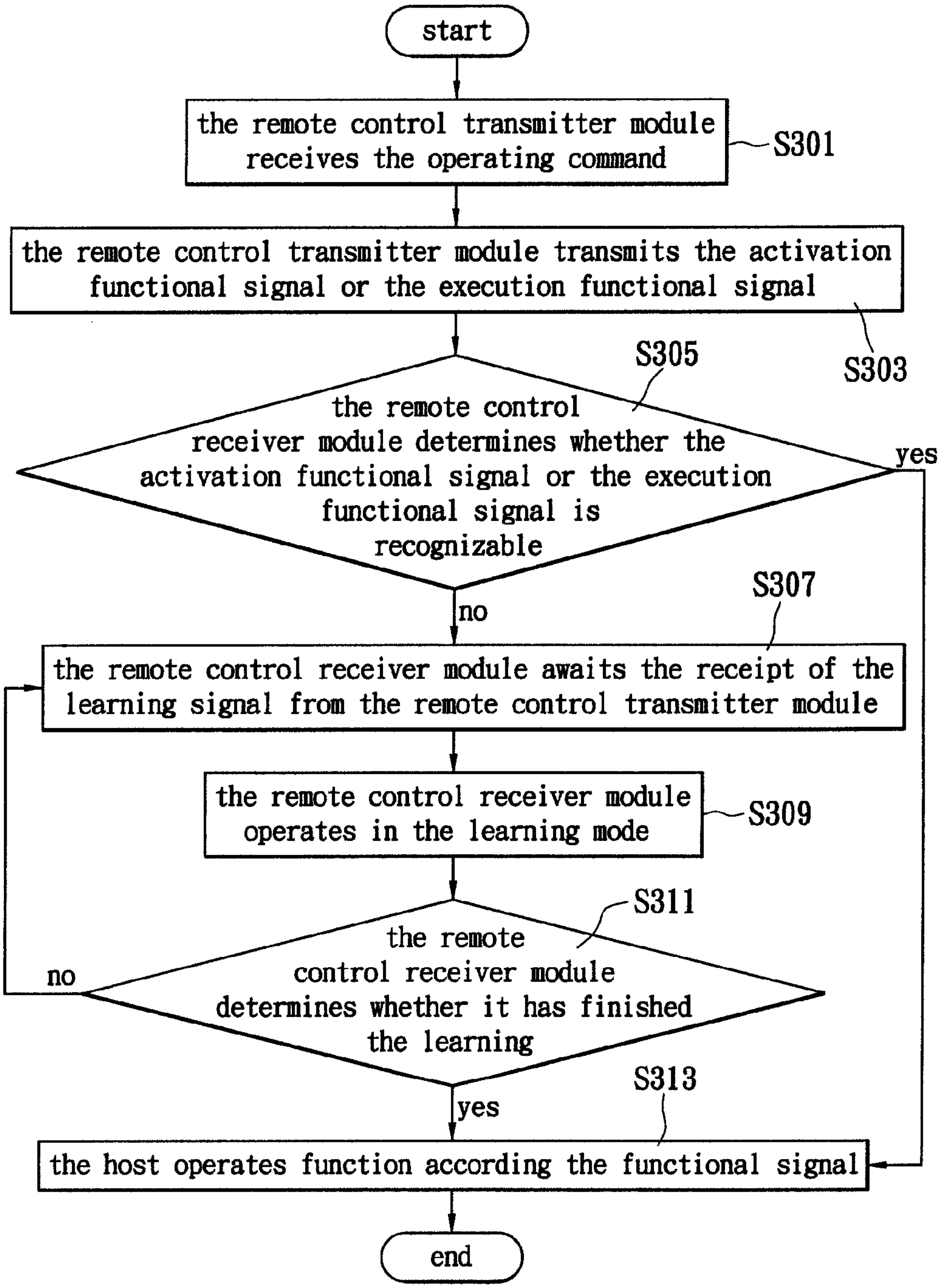
FIG. 3 is a flowchart illustrating a remote control learning method in accordance with one embodiment of the present invention.

In conjunction with FIGS. 1 and 2, FIG. 3 is a flowchart illustrating a remote control learning method in accordance with one embodiment of the present invention.

In the beginning, since the user may not have any knowledge that whether the remote control device 50 could be recognized the host 40 the remote control transmitter module 10 usually receives the operating command (S301). Such operating command is thus from the press of the activation functional key 531 or other execution functional key 533. The operating unit 101 receives the operating command and the first processing unit 102 converts the operating command to the activation functional signal or the execution functional signal and transmits them via the wireless radio frequency transmitting unit 103 (S303). The remote control receiver module 20 receives the activation functional signal or the execution functional signal via the wireless radio frequency receiving unit 203 and the second processing unit 202 determines whether they are recognizable (S305). If they are recognizable, which means the serial number of the received signal is consistent with the default serial number stored in the memory unit 201 the second processing unit 202 transmits the activation functional signal or the execution functional signal to the microprocessor of the host 40 so as to cause the host 40 to function (S313). If they are not recognizable, the remote control receiver module 20 awaits the receipt of the learning signal from the remote control transmitter module 10 (S307). The learning signal may be generated by the press of the learning key 51. The remote control receiver module 20 operates in the learning mode after receiving the learning signal (S309). The second processing unit 202 determines whether the remote control receiver module 20 has finished the learning (S311). If so, the remote control receiver module 20 could recognize the functional signal transmitted from the remote control transmitter module 10. And the second processing unit 202 transmits the functional code of the functional signal to the microprocessor of the host 40 to cause the host 40 to function accordingly. (S313) If not, the process goes back to S307 in which the remote control receiver module 20 waits for the receipt of the learning signal transmitted from the remote control transmitter module.

Figure 4:
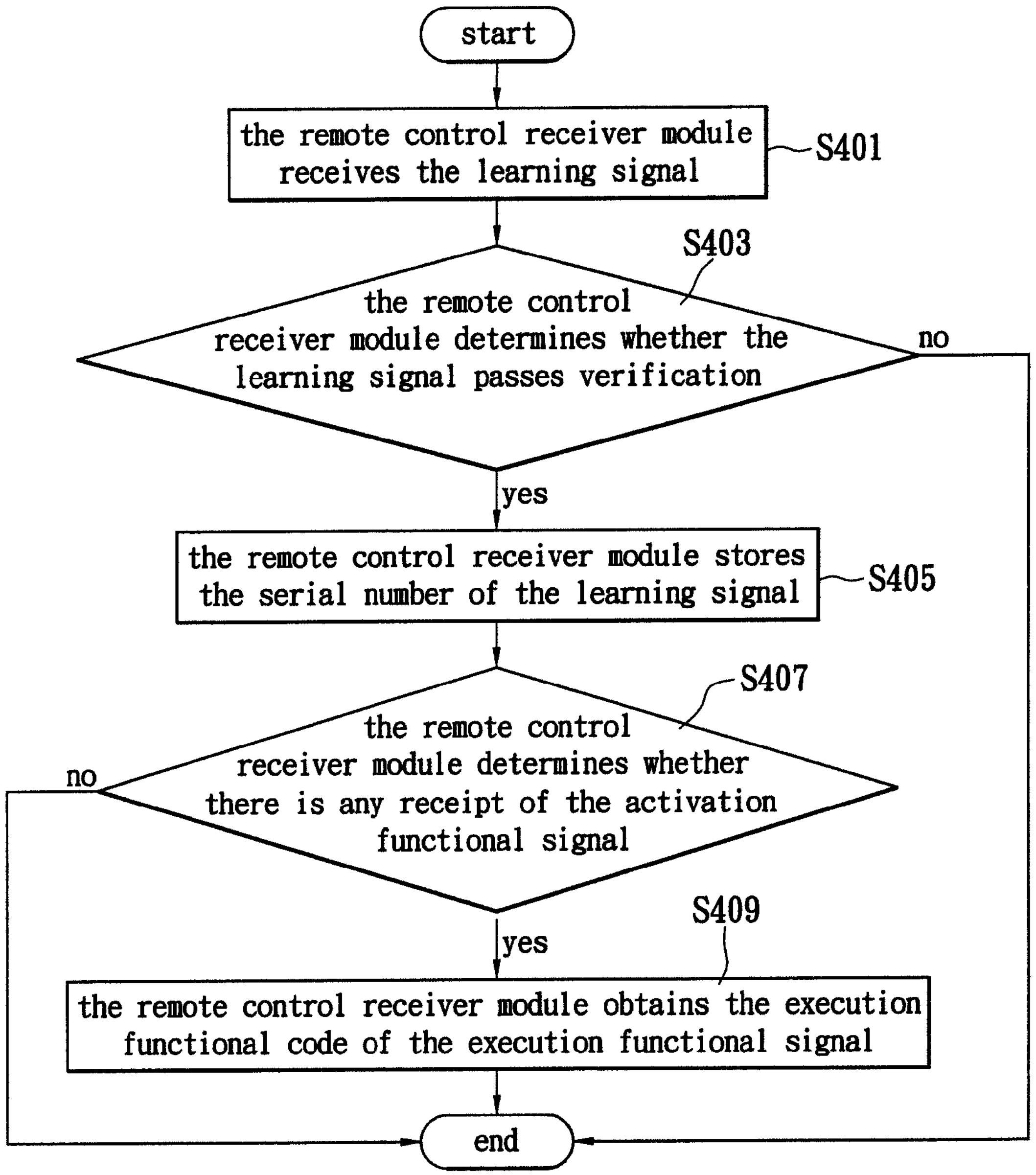
FIG. 4 is a flowchart illustrating a remote control learning method when a remote control receiver module operates in a learning mode in accordance with one embodiment of the present invention.

FIG. 4 is a flowchart illustrating remote control learning method when a remote control receiver module 20 operates in a learning mode in accordance with one embodiment of the present invention.

The second processing unit 202 receives the learning signal via the wireless radio frequency receiving unit 203 (S401). The second processing unit 202 determines whether the learning signal passes verification in S403. In the other words, the second processing unit 202 compares the identification code of the learning signal with the default identification code stored in the memory unit 201. If they the identification code of the learning signal and the default identification code are consistent, the remote control receiver module 20 could communicate with the remote control transmitter module 10 and store the serial number of the learning signal in the memory unit 201 such as the manufacturing date of the remote control transmitter module 10 (S405). Further, the remote control receiver module 20 instructs the user to operate the remote control transmitter module 10 for emitting the activation functional signal in order to enable the host 40 to function in accordance with the functional key 53. The second processing unit 202 determines whether there is any receipt of the activation functional signal (S407). If the second processing unit 202 receives the activation functional signal and thus obtains the execution functional code of the execution functional signal by converting the activation functional signal with the logic operation (S409). Thus, the remote control receiver module 20 could recognize the execution functional signal before the corresponding function associated with the execution functional signal could be performed.

What are disclosed above are only the specification and the drawings of the preferred embodiment of the present invention and it is therefore not intended that the present invention be limited to the particular embodiment disclosed. It will be understood by those skilled in the art that various equivalent changes may be made depending on the specification and the drawings of the present invention without departing from the scope of the present invention.

What is claimed is:

1. A remote control system, comprising:

a remote control transmitter module for transmitting a learning signal or a functional signal; and a remote control receiver module in a host for receiving the learning signal or the functional signal, for verifying the learning signal and the functional signal by comparing an identification code of the learning signal or of the functional signal to a default identification code of the remote control receiver module such that the remote control receiver module operates in a learning mode upon a receipt of the learning signal or controls the host to operate functions according to the functional signal;

wherein when the remote control receiver module operates in the learning mode the remote control receiver module is configured to verify and store the learning signal for recognizing an identity of the remote control transmitter module.

2. The remote control system as claimed in claim 1, wherein the remote control transmitter module communicates with the remote control receiver module through a radio frequency.

3. The remote control system as claimed in claim 1, wherein both the learning signal and the functional signal comprise the identification code and a serial number.

4. The remote control system as claimed in claim 3, wherein the learning signal further comprises a learning code.

5. The remote control system as claimed in claim 3, wherein the functional signal comprises a functional code.

6. The remote control system as claimed in claim 5, wherein the remote control transmitter module comprises:

an operating unit for receiving an operating command;

a first processing unit connected to the operating unit for converting the operating command into the learning signal or the functional signal; and a wireless radio frequency transmitting unit connected to the first processing unit for transmitting the learning signal or the functional signal.

7. The remote control system as claimed in claim 6, wherein the operating unit comprises a learning key and a plurality of functional keys.

8. The remote control system as claimed in claim 7, wherein the remote control receiver module comprises:

a wireless radio frequency receiving unit for receiving the learning signal or the functional signal;

a memory unit for storing the default identification code; and a second processing unit connected to the wireless radio frequency receiving unit and the memory unit, respectively, for verifying the learning signal and the functional signal by comparing the identification code to the default identification code.

9. The remote control system as claimed in claim 8, wherein the memory unit further stores a default serial number wherein the second processing unit is configured to compare the serial number and the default serial number so as to recognize the identity of the remote control transmitter module.

10. The remote control system as claimed in claim 9, wherein the memory unit further stores a default functional code wherein the second processing unit is configured to compare the default functional code and the functional code to cause the host to function according to the functional code.

11. A remote control learning method adapted for a remote control system, wherein the remote control system comprises a remote control transmitter module and a remote control receiver module, the remote control learning method comprising:

receiving a learning signal from the remote control transmitter module by the remote control receiver module;

determining whether the learning signal passes a verification by the remote control receiver module;

if the learning signal passes the verification storing the learning signal by the remote control receiver module;

determining whether there is an activation functional received from the remote control transmitter module by the remote control receiver module; and if there is the activation functional signal received from the remote control transmitter module retrieving a plurality of execution functional codes of a plurality of execution signals of the remote control transmitter.

12. The remote control learning method as claimed in claim 11, wherein determining whether the learning signal passes the verification compares an identification code of the learning signal and a default identification code stored in the remote control receiver module.

13. The remote control learning method as claimed in claim 12, wherein when the identification code is consistent with the default identification code the learning signal passes the verification.

14. The remote control learning method as claimed in claim 12, wherein when the identification code is inconsistent with the default identification code the learning signal does not pass the verification.

15. The remote control learning method as claimed in claim 11, further comprising:

receiving an operating command by the remote control transmitter module;

transmitting the activation functional signal or the execution functional signal by the remote control transmitter module;

determining whether the activation functional signal or the execution functional signal is recognized by the remote control receiver module; and if the activation functional signal or the execution functional signal is not recognized awaiting the learning signal by the remote control receiver module.

16. The remote control learning method as claimed in claim 15, wherein determining whether the activation functional signal or the execution functional signal is recognized compares a serial number of the functional signal and a default serial number in the remote control receiver module.

17. The remote control learning method as claimed in claim 16, wherein when the serial number is consistent with the default serial number the activation functional signal or the execution functional signal is recognized.

18. The remote control learning method as claimed in claim 16, wherein when the serial number is inconsistent with the default serial number the activation functional signal or the execution functional signal is not recognized.

19. The remote control learning method as claimed in claim 11, further comprising:

determining whether to store the serial number in the remote control receiver module;

if no serial number is stored in the remote control receiver module awaiting the activation function signal from the remote control transmitter module;

storing the serial number in the remote control receiver module;

determining whether to store the execution functional codes in the remote control receiver module; and if no execution functional code stored in the remote control receiver module retrieving the execution functional codes.

20. The remote control learning method as claimed in claim 19, wherein retrieving the execution functional codes converts the activation functional signal by a logic operation.

* * * * *